United States Patent [19]

Sipma

[11] Patent Number: 5,149,976
[45] Date of Patent: Sep. 22, 1992

[54] CHARGED PARTICLE BEAM PATTERN GENERATION APPARATUS AND METHOD

[75] Inventor: Dale M. Sipma, Sherman Oaks, Calif.

[73] Assignee: Hughes Aircraft Company, Los Angeles, Calif.

[21] Appl. No.: 576,577

[22] Filed: Aug. 31, 1990

[51] Int. Cl.$^5$ ............................................. H01J 37/302
[52] U.S. Cl. ................................ 250/492.2; 250/491.1; 250/396 R
[58] Field of Search ............ 250/492.2, 492.21, 492.22, 250/491.1, 396 R

[56] References Cited

U.S. PATENT DOCUMENTS

| | | | |
|---|---|---|---|
| 4,563,587 | 1/1986 | Ward et al. | 250/396 R |
| 4,670,685 | 6/1987 | Clark et al. | 313/230 |
| 4,891,526 | 1/1990 | Reeds | 250/442.1 |

FOREIGN PATENT DOCUMENTS

| | | | |
|---|---|---|---|
| 53-80168 | 7/1978 | Japan | 250/492.22 |
| 57-211733 | 12/1982 | Japan | 250/492.2 |
| 58-125827 | 7/1983 | Japan | 250/492.22 |

OTHER PUBLICATIONS

Wilson et al., Scanning Electron Microscopy 1976 (Part IV), Apr., 1976, pp. 659-668.
"A mass-separating focused-ion-beam system for maskless ion implantation", V. Wang, et al., J. Vac. Sci. Technol., 19(4), Nov./Dec. 1981, pp. 1158-1163.
"An electron beam lithography system for submicron VHSIC device fabrication", H. J. King, et al., J. Vac. Sci. Technol. B3(1), Jan./Feb. 1985, pp. 106-111.
"Electron-beam lithography machines", D. R. Herriott, et al., Electron-Beam Technology in Microelectronic Fabrication, ISBNO-12-133550-X, pp. 186-196.
"EBCAD-Fully integrated pattern data processing for direct write electron-beam lithography systems", O. W. Otto, J. Vac. Sci. Technol., 19(4), Nov./Dec. 1981, pp. 993-997.
"Measuring the performance of the Aeble 150 direct-write e-beam lithography equipment", A. M. Carroll, et al., SPIE vol. 537 Electron-Beam, X-Ray, and Ion-Beam Techniques for Submicrometer Lithographies IV (1985), pp. 25-33.
"High speed precision X-Y stage", R. Reeds, et al., J. Vac. Sci. Technol. B3(1), Jan./Feb. 1985, pp. 112-116.
"Digitally positioned mechanical stage", J. Pasiecznik, et al., J. Vac. Sci. Technol., 15(3), May/Jun. 1978, pp. 909-912.

*Primary Examiner*—Jack I. Berman
*Attorney, Agent, or Firm*—V. D. Duraiswamy; W. K. Denson-Low

[57] ABSTRACT

A pattern control system and method for a charged particle beam such as a focused ion beam (FIB) (20) or electron beam writes beam patterns on a pixel-by-pixel (56) basis. Respective dwell times and beam blanking states are specified for each separate pixel location (56), enabling the creation of arbitrary patterns and various implantation gradients. Pixel commands are generated by a central processing unit (CPU) (104), which can be relieved by hardware pattern generators (FIG. 10) for frequently used patterns. The system also includes improvements in stigmation control, fiducial mark recognition and the reconciliation of the beam and target coordinate systems.

32 Claims, 10 Drawing Sheets

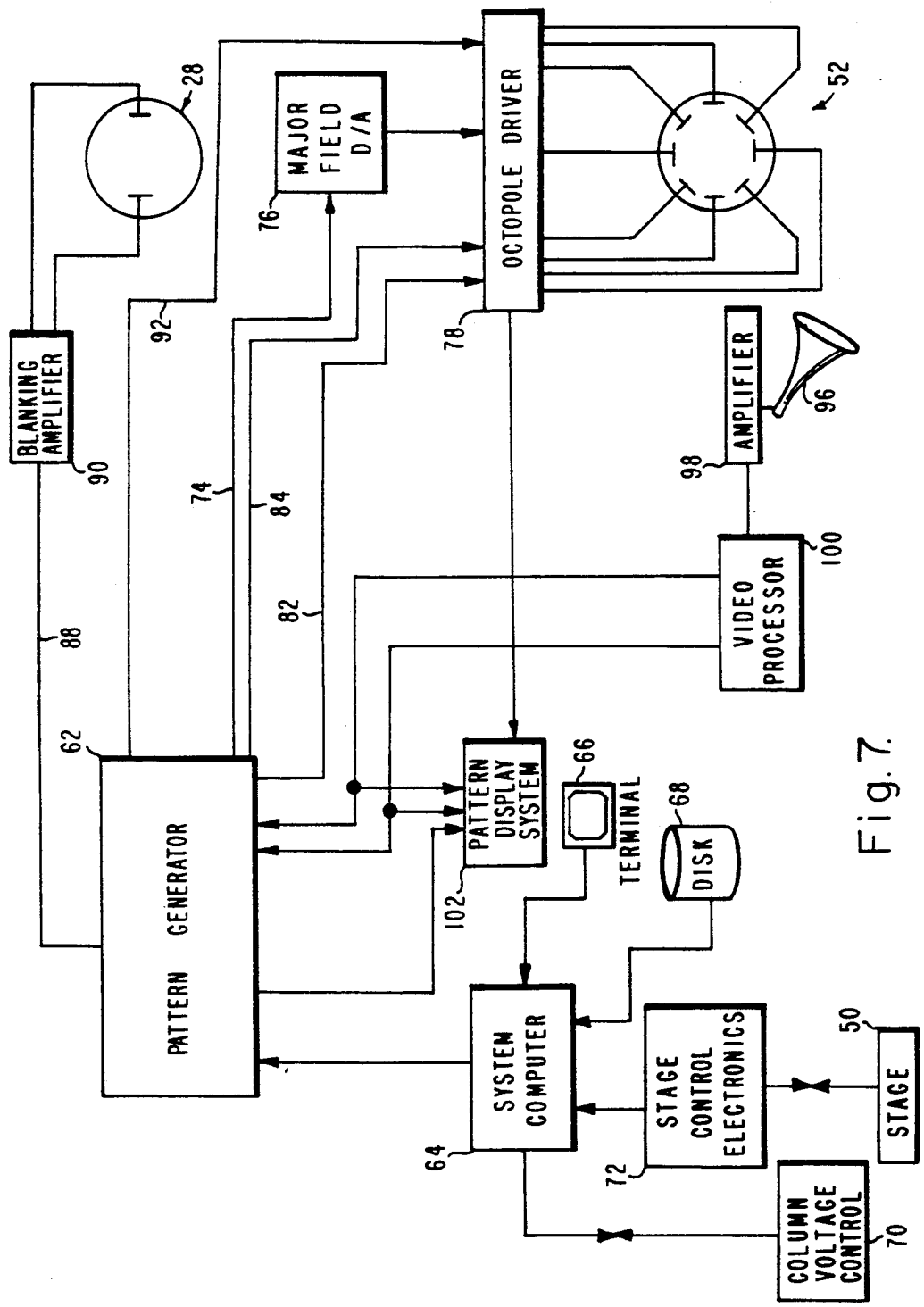

CHARGED PARTICLE BEAM PATTERN GENERATION APPARATUS AND METHOD

BACKGROUND OF THE INVENTION

1. Field of the Invention

This invention relates to charged particle beams such as focused ion beams and electron beams that move across a target surface, and more particularly to apparatus and methods for controlling the beam movement.

2. Description of the Related Art

Charged particle beams such as focused ion beams (FIBs) and electron beams may be used for implantation into a substrate, scanning a target to locate a fiducial mark, and in the case of ion beams dislodging material from a target surface such as by sputtering. While the remainder of this discussion will concentrate on FIBs, the invention is also applicable to other charged particle beams that are scanned across a surface.

A FIB column focuses an ion beam to a fine point and directs it to a precise region on a surface, usually for the purpose of implanting beam ions into the surface. The doping produced with a FIB is determined by the type of dopant ions used. The ion implant density is controlled by the ion current density in the beam and the dwell time on the substrate, while the depth of implant is controlled by the beam voltage (energy). Accurately defined lines, rectangles and trapezoids can be formed by scanning the beam across successive adjacent lines to fill a desired area. A representative ion beam column is disclosed in V. Wang, J. W. Ward and R. L. Seliger, "A Mass Separating Focused Ion Beam System for Maskless Ion Implantation", *Journal of Vacuum Science and Technology*, Nov.-Dec. 1981, pages 1158-63.

The primary purpose of using a FIB is to eliminate the conventional masking steps, and thereby increase the accuracy of implanting ions into a semiconductor. U.S. Pat. No. 4,563,587 issued Jan. 7, 1986 to Ward, et al. and assigned to Hughes Aircraft Company, the assignee of the present invention, discloses a focused ion beam column for implanting ions into semiconductor wafers. An ion beam is obtained from an ion source that typically emits several species of ions. One type of ion is selected and the voltage of the column's mass separator is set so that unwanted ions are deflected. The remaining chosen ions are accelerated through the column and directed onto the target wafer.

While offering significant advantages over the use of masks for implantation, current FIB systems are also somewhat limited. An octopole deflector is normally used to scan the beam, in a straight line and at a constant speed, over the target surface. If a greater implant density is desired, the scanning speed can be slowed and/or the beam can perform multiple scans over the same line. If a doping gradient is desired for a particular line, multiple lines of progressively shorter length are superimposed over each other. This is a time consuming process, requiring an adjustment after each line segment, and significantly reduces throughput.

Three-dimensional rectangle and trapezoid patterns can be developed by scanning a series of adjacent lines. If a doping gradient is desired from line to line, multiple scans can be superimposed over desired lines, with the number of scans increasing or decreasing for successive lines in accordance with the desired gradient. Again, this is a time consuming process, and the number of available geometric patterns is quite limited.

A variety of inaccuracies are also inherent in current systems. For example, a finite amount of time is required to process the control signals and for the beam to travel between the mass separator and the target. This delay can result in the beam particles not reaching the target until scanning has already begun, and in scanning beyond the intended termination of a line. Another example involves the control of stigmation, which is the degree of roundness or circularity of the beam. The beam is generally somewhat elliptical when it enters the octopole deflector, and a voltage pattern is applied to the deflector plates to make it more round. Only a limited correction is currently available to account for specific angles between the beam's major elliptical axis and the octopole axis, such as 45° or 90°, but not the angles in between.

Another example of a built-in inaccuracy is in the location of fiducial marks on the target surfaces. The beam is scanned across the surface to detect the leading and trailing edges of a fiducial mark. However, because of delays in the beam transit time and signal processing, the detected location of the mark may be inaccurate.

Another problem is that there is generally some misalignment between the x-y coordinate systems for the octopole deflector and the target wafer. To adapt the beam deflection to the wafer position, the beam's coordinate system must be transformed to match that of the wafer. This is currently performed with analog coordinate transformation circuitry located just prior to the octopole synthesis circuitry used to transform the x, y deflection commands into the eight octopole plate signals. This in effect adds more stages to the analog synthesis circuitry, reducing the system bandwidth, increasing the system noise, and in general slowing it down.

SUMMARY OF THE INVENTION

A new charged particle beam system, and a related method of exposing a surface to the beam, is disclosed which is considerably more flexible than prior systems in the types of patterns that can be written, and in the formation of implantation gradients within the patterns. The new system has a considerably greater throughput for complicated patterns, and includes both improved stigmation control for an octopole deflector and a fiducial mark recognition capability that eliminates the effect of beam and signal processing delays, as well as a reconciliation of the beam and target coordinate systems which overcomes the problems of prior approaches. Additional speed of operation is gained by an ability to create implantation patterns at the same time another pattern is being written.

Rather than scanning the beam in a continuous line, the beam is deflected through a sequence of successive pixel locations, with its dwell time and blanking state at each of the locations separately controlled. Various gradient patterns can be formed by adjusting either the beam dwell time for different pixel locations, or the spacing between successive pixels. Dwell time and spacing gradients can be stored in memory and called up as desired to relieve the demands on a central processing unit (CPU) used to control the beam movement. A separate hardware mechanism can be provided to generate beam deflection patterns in response to an initial deflection provided by the CPU. The beam position is clocked out of a pattern memory by a clock that is programmable to coordinate the data transfer with the desired beam dwell times.

Controlling the movement of the beam on a pixel-by-pixel basis allows for the development of doping gradients in a single scan, and the generation of arbitrary shapes. Although the beam is normally scanned linearly from pixel to pixel, in principle it can be made to generate a pattern by jumping between successive pixels within the pattern.

Other features include a stigmation control in which the voltage signals applied to the various octopole plates are governed by sinusoidal functions so that stigmation can be controlled for any arbitrary angle between the beam's elliptical axis and the plates. Fiducial marks are recognized by scanning a mark repeatedly in opposite directions and averaging the locations of detected crossings for each scan; the beam and signal processing delays associated with scanning in opposite directions cancel.

The target coordinate system is reconciled with the beam deflection coordinate system at an early stage which avoids the reduction in system bandwidth, increased noise and reduction in speed encountered with prior systems. Pixel location and corresponding beam blanking state information are stored in a memory, from where they can be applied to control the beam deflection in coordination with a sequence of pixel dwell times. Coordinate system reconciliation is achieved by adjusting the sequence of pixel location information prior to its being fed into the memory.

To provide enough deflection electronics settling time to move to the initial pixel location at the beginning of an implantation, the initial pixel location command is repeated several times, with the beam blanked during all but the final command of the initializing sequence. To compensate for the beam transit time between the mass separator and the octopole deflector, the beam's dwell time command at the initial pixel location is extended somewhat, and the beam is blanked a corresponding time prior to the end of its dwell period at the last pixel location in the sequence.

Further features and advantages of the invention will be apparent to those skilled in the art from the following detailed description, taken together with the accompanying drawings, in which:

DESCRIPTION OF THE DRAWINGS

FIG. 7 is a block diagram of the FIB pattern generation system of the present invention;

DETAILED DESCRIPTION OF THE INVENTION

Figure 1:
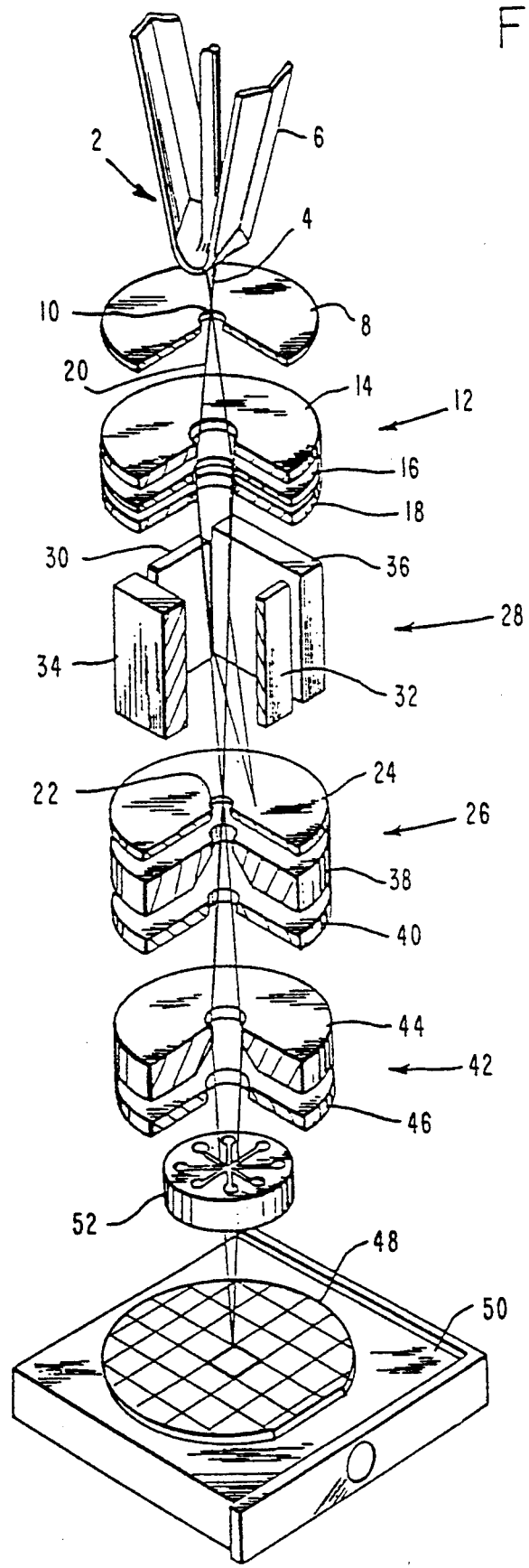
FIG. 1 is a schematic perspective view of a FIB column as taught in U.S. Pat. No. 4,563,587.
Figure 2:
FIG. 2 is an illustration of the conventional line scanning approach.

FIG. 1 shows a preferred form of FIB column with which the present invention can be used. However, the invention is not limited to any particular kind of FIB column, and is also applicable to e-beams or other small diameter charged particle beams. The particular FIB column shown in FIG. 2 is described in further detail in U.S. Pat. No. 4,563,587.

A high brightness ion source 2 produces a beam of charged particles emanating from a very small point. Ion source 2 is preferably a liquid-metal source from an alloy that contains boron, arsenic and phosphorous. Suitable ion sources are described in U.S. Pat. No. 4,670,685 issued Jun. 2, 1987 to Clark, Jr. et al. and assigned to Hughes Aircraft Company, the assignee of the present invention.

A sharp point 4 extends through the apex of a hairpin shaped heater 6 in the ion source. The feed metal used to supply ions is moved by capillary action to point 4, where it is ionized in an electric field. An extraction electrode 8 having a central beam opening 10 on the axis of the ion beam is used to extract ions from the source.

An objective lens 12, in the form of an einzel lens having electrodes 14, 16 and 18, focuses the beam emerging from extraction electrode 8. Each of the three lens electrodes has a beam opening through its center on the beam axis. Objective lens 12 is intended to operate in the accelerating mode, in which the ions are accelerated between electrodes 14 and 16 and are subsequently decelerated back to the input energy level between electrodes 16 and 18. The ion beam 20 extracted by electrode 8 is magnified and focused by objective lens 12 to a crossover at an analyzer opening 22 in a aperture plate 24 located above a pre-accelerator lens 26.

An ExB mass separator 28 is positioned along the beam path between objective lens 12 and pre-accelerator lens 26. While the mass separator may be placed at different locations in the FIB column, the beam energy at the position shown in FIG. 1 is low, and thus an ExB mass separator having low magnetic and electric field strengths may be used.

In mass separator 28, electric field plates 30 and 32 are positioned parallel to and facing each other, and parallel to the column's center axis. A pair of magnetic pole plates 34 and 36 face each other on opposite sides of the beam, at right angles to the electric field plates 30 and 32. The magnetic pole plates are connected to a magnetic field producing device such as a permanent magnet or an electric coil.

An ion of a selected species passes straight through the mass separator and through beam opening 22. Ions of other species are deflected by the mass separator onto plate 24; in this condition the beam is said to be "blanked". For a given energy and ion charge, the degree of ion deflection away from beam opening 22 will vary with the difference in charge to mass ratios between the deflected ions and the selected ions. Ions with progressively larger charge to mass ratios will be deflected progressively further away on one side of the opening, while ions with progressively smaller values will be deflected progressively further away on the opposite side of the opening.

The selected ion species passes through the preaccelerator lens 26, which is comprised of electrodes 38 and 40. Lens 26 changes the beam energy before it enters the final accelerating lens 42. This lens includes electrodes 44 and 46 which apply a final accelerating voltage to the beam. The lens also focuses and demagnifies the beam from pre-accelerator lens 26 onto a target 48, shown as a semiconductor wafer. The demagnification of final accelerator lens 42 produces the desired small beam spot on the target.

The target substrate 48 is mounted on a stage 50 that may be movable to present different areas of the substrate to the beam. Movement of the ion beam on the target is produced by a beam deflection apparatus 52, which is positioned around the beam between final accelerator lens 42 and target 48. Beam deflector 52 is preferably an eight-pole device referred to as an octopole; the beam deflection is determined by the relative voltages applied to each of the pole plates.

The conventional approach to implantation with a FIB, generally referred to as "writing", is illustrated in FIG. 2. To implant an area, the FIB is scanned across the target surface in a series of parallel, adjacent scans 54. Each scan is performed at a constant speed, so that with single scans a generally constant implantation dose is produced across the entire pattern. The beam is normally oscillated back and forth along a constant x-axis, while the target is incremented in the y direction between each successive line scan to develop a two-dimensional pattern. The beam is blanked at the end of a line scan, and remains blanked until it is again permitted to reach the target at the beginning of the next line.

The implantation dosage is controlled by setting the beam to deliver not more than the minimum desired dosage, and repeating scan lines if a greater dosage is required. A dosage gradient can be developed between successive scan lines by repeating the scanning of each line a different number of times. If a dosage gradient is desired within a single line, the beam is first scanned across the entire line, and then the scanning is repeated for progressively shorter lengths of the line until the gradient is achieved.

Figure 3:
FIG. 3 is an illustration of the pixelized beam writing approach of the present invention.

The present invention takes an entirely different approach to controlling the FIB. Instead of using line scans as basic units of implantation, the present invention takes a single fixed location at which the beam may dwell as its basic unit. These locations are referred to as "pixels" to emphasize the fact that they are mutually discrete, and yet collectively can form broader overall patterns. This is illustrated in simplified form in FIG. 3, in which a single line scan is shown as the result of a succession of separate implantation pixels 56.

Figure 4:
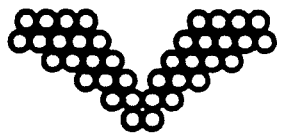
FIG. 4 illustrates an example of an arbitrary pattern written in accordance with the invention.

Each pixel is assigned its own location on the target. While lines and patterns will normally be developed by minimizing the spacing between successive pixel locations to minimize the total beam movement, the invention is not limited to such an approach. It also encompasses arbitrary movements of the FIB between successive pixel locations that may be significantly spaced apart from each other on the substrate surface. A virtually unlimited number of implantation patterns may thus be generated that are difficult or impossible to accomplish with conventional FIB systems. One such arbitrary pattern is illustrated in FIG. 4; the pattern has no particular function, and is given as an example only.

Figure 5:
FIGS. 5 and 6 are illustrations showing how an implantation gradient can be developed through corresponding gradients in the pixel locations and dwell times, respectively.

A discrete beam dwell time and blanking state are specified for each individual pixel location. Thus, the duration of the beam dwell at each location may be adjusted from pixel to pixel, and implantation may be blocked entirely for given pixels by specifying a blanked state. This control over the beam movement, together with the capability of adjusting the beam dwell time for different pixels, is particularly advantageous in developing implantation gradients. A simple case of a gradient along a single line is illustrated in FIG. 5. With this approach the spacing between successive pixels 58 is progressively diminished, so that the pixels increasingly overlap each other as the implantation proceeds from left to right. Assuming a constant dwell time for each pixel, a doping gradient will be developed from a relatively low doping level at the left end of the line to a relatively higher doping level at the right end. To produce a gradient in the opposite direction, the pixel spacings would be progressively increased from left to right.

Figure 6:
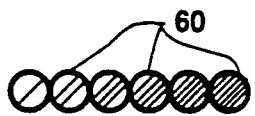

Another approach to developing a doping gradient in accordance with the invention is to vary the beam dwell times for successive pixel locations. This is illustrated in FIG. 6, in which the duration of the dwell time at each pixel 60 is indicated by the darkness of the shading. The beam dwell time is relatively short for the left most pixel, but progressively increases as the beam moves to the right to produce a gradient similar to that of FIG. 5.

FIG. 7 is a block diagram of the overall FIB control system. A FIB pattern generator unit 62 receives basic pattern information and commands from a system computer 64, and generates the required deflection, blanking and dwell time signals for pattern writing. The required beam deflection potentions are generated from a digital beam position value (pixel location) stored in a digital memory. The pixel data is clocked out of a high speed figure store memory at a programmed rate. The time between pixel steps (the beam dwell time) is programmable. The beam dwell time is completely independent of the size of the steps between pixels.

Various input mechanisms such as a terminal 66 or disk 68 may be used to supply input information to the system computer 64. The computer may be used to set and confirm the voltages of the FIB column through a column voltage control circuit 70, and to control and monitor the position of stage 50 through stage control electronics 72.

The pattern generator 62 operates with a conventional major field/minor field mode. The major field refers to the general area on the substrate where FIB writing is to take place, while the minor field refers to the particular FIB pattern to be written. The major field may be moved among different positions, preserving the same minor field pattern. This ability to apply a single minor field pattern to different locations on the substrate via major field movements results in a reduced system processing load, as compared to a requirement to generate unique pattern data for each different major field location. The pattern is normally no larger than one-fifth the size of the major field. Larger patterns may require pattern stitching. A digital signal representing the selected major field is supplied over data link 74 to a major field digital-to-analog converter 76, which in turn provides an appropriate analog signal to a drive system 78 for the octopole deflector 52.

The pattern generator 62 causes a specific pattern to be written by generating minor field analog signals, which are applied to the octopole driver 78 over lines 82, 84 for application to the octopole deflection plates 86. The minor field signals represent a succession of FIB pixel locations, and corresponding dwell times at each location. This is the basic control mechanism for developing a desired implantation pattern.

Associated with each pixel is a blanking state bit which causes the beam to be blanked or unblanked during pattern writing. The blanking state is also controllable by sending commands from the system computer 64 to the pattern generator 62.

A blanking control signal is developed by the pattern generator 62 and transmitted over a high speed fiberoptic link 88 to a blanking amplifier 90, which provides corresponding control signals for the mass separator 28. The blanking control signals are synchronized with the x,y FIB deflection signals applied to the octopole driver 78 so that the correct blanking state is applied to the beam by mass separator 28 for each different pixel location. Instead of a mass separator, separate beam plates could be used for the blanking function.

The FIB is normally somewhat elliptical in cross-section. To make it more round, stigmation control signals may be generated by the pattern generator 62 and applied over line 92 to the octopole driver circuit 78. Potentials of equal amplitude are applied to opposing deflection plates and potentials of opposite sign are applied to deflection plates that are separated by 90 degrees. A novel stigmation control scheme which can account for any arbitrary axis of beam ellipticity is described below in connection with FIG. 15.

The location of the FIB on the substrate can be detected by a conventional secondary emission detector 96, which receives secondary emissions from the substrate resulting from the beam impact. This detection capability can be used, for example, to detect when the beam has crossed the edge of a fiducial mark used for initial alignment. The detector output is applied to an amplifier 98, the output of which is supplied to a video processor 100 that generates corresponding output signals suitable for application to the pattern generator 62. The video processor 100 output may also be supplied to an oscilloscope pattern display system 102 that visually displays the FIB pattern on the substrate. The pattern display system 102 may also receive an input from the octopole driver 78 for monitor and calibration purposes, and another input from pattern generator 62 to display the generated pattern at this stage.

Patterns are created by the pattern generator 62 based upon information received from the system computer 64. The required information usually consists of a pattern type code followed by location and dimension information such as the coordinates of vertices, the number of steps in a particular direction, and the beam dwell time for the various pixel locations. The dimensional pattern data sent to the pattern generator is without scaling for the deflection properties of the FIB system, other than pattern size limits. The pattern generator scales the pattern data before writing it into a figure store, described below.

The system computer 64 or other off-line computer partitions larger patterns into the smaller patterns required by the pattern generator 62, and generates the pattern center information necessary to stitch smaller patterns together. Data required to locate the center of a pattern within a major field is transformed to reflect current FIB system deflection parameters before being sent to the pattern generator 62 by the system computer 64. The size of a major field is normally fixed for a given FIB system.

Since patterns are created by an arbitrary sequence of pixel locations stored in a figure store within the pattern generator 62, there are no restrictions on the pattern shapes than can be generated. Special patterns can be created by software in the pattern generator, or by a point-by-point download of data from the system computer 64. Frequently used patterns can also be stored in read only memory in the pattern generator 62.

Figure 8:
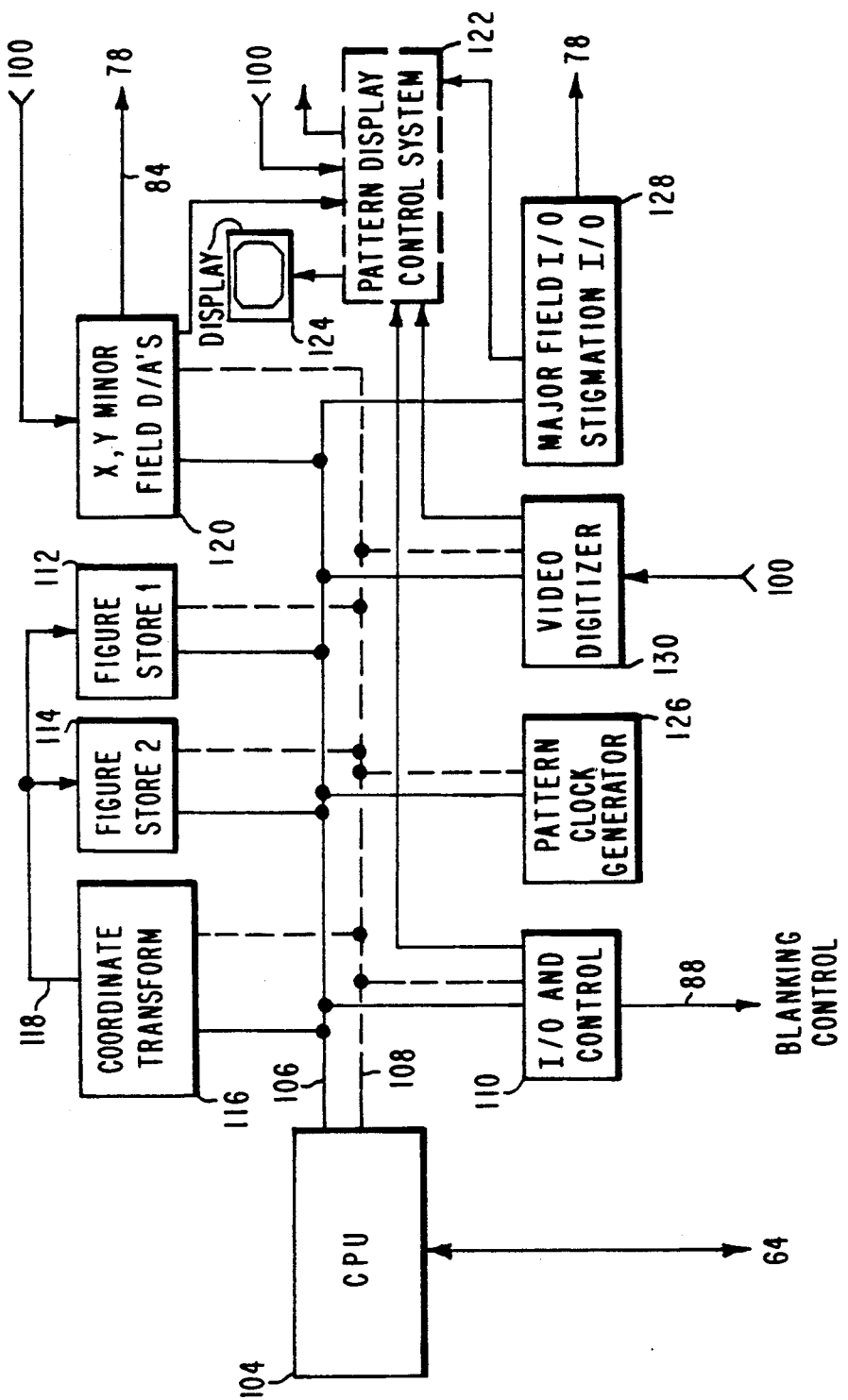
FIG. 8 is a block diagram showing the functional units of the FIB pattern generator.

A block diagram of the pattern generator is shown in FIG. 8. Physically, the pattern generator is preferably implemented as a rack with individual plug-in cards for each of the functional units in FIG. 8. The pattern generator employs a central processing unit (CPU) 104, which may be provided as a model OB68k/VMEI VME/68000 single board computer manufactured by Omnibyte Corporation. An open design architecture allows for the addition of various subsystems, such as a hardware accelerator described below, to improve performance. Two back planes are used for communication between cards as required. A VME P1 type back plane 106 provides VME Standard Signals as required between the CPU 104 and the other system boards; a VME P2 type back plane 108 is used for board-to-board connections and most I/O functions.

CPU 104 processes command string data from the system computer 64, generates pattern pixel position data based upon pattern primitives, controls the pattern writing process, and performs calculations relevant to pattern registration. Control of the pattern generator functional blocks by CPU 104 is accomplished by read or write operations to a memory location, with or without data. Control strobes for most pattern generator functions are generated on an I/O and Control Card 110. Blanking control logic and a high speed fiber optic transmitter used to transmit blanking information to the FIB column is also located on the I/O and Control Card 110.

Multiple figure stores 112, 114 are provided which allow the pattern generator to control the FIB to write a pattern held in one figure store, while the CPU 104 is loading a new pattern into the other figure store memory. Additional figure stores could also be provided. The figure store memory is part of the CPU memory space, and can be written by the CPU like any other memory. The X and Y data for a given pixel occupy adjacent memory locations.

Pixel information can also be written into the figure stores 112, 114 from a minor field coordinate transform data formatter 116, located between the CPU bus 106 and the figure stores, through a local data/communication bus 118. The coordinate transform function reformats the pixel data to reconcile detected differences between the X, Y coordinate system of the target 48 and that of the FIB deflection system. Hardware multipliers and a hardware adder in the data path between the CPU bus 106 and the figure stores perform this function, using two's complement arithmetic. Differences between the target and FIB system nominal coordinates can be detected by doing a test run, deflecting the FIB in X, Y movements according to the FIB coordinate system, and monitoring how these movements match the target coordinate system.

While the reformatting of FIB control data to reconcile the two coordinate systems is not new per se for prior non-pixelized FIB control systems, in prior systems the reformatting was accomplished with analog coordinate transformation circuitry located just prior to the octopole synthesis circuitry 78 used to transform the X, Y deflection commands into the eight octopole plate signals. This in effect added more stages to the analog synthesis circuitry, reducing the system bandwidth, increasing the system noise, and slowing it down.

The present system substitutes digital coordinate transformation for the prior analog transformation, and locates it well upstream from the octopole synthesis circuitry. This produces a more precise coordinate transformation, and avoids the above problems associated with the downstream analog transformation circuitry.

The twelve bit X or Y pixel position data from either figure store 112 or 114 is converted to an analog signal by high speed digital-to-analog converters 120, preferably having 35 nanosecond settling times. The DACs 120 send analog outputs to the octopole drive synthesis circuitry over output line 84, and may also provide a buffered output to a pattern display control system 122 which drives a pattern display oscillograph 124; elements 122 and 124 comprise the pattern display system 102 shown in FIG. 7. For setup and diagnostic purposes, x,y sweep signals from the video processor 100 are connected to external inputs on the DACs 120.

The rate at which pattern data is clocked out of the figure stores, which corresponds to the pixel dwell times, is determined by a programmable clock generator 126. A 100 MHz crystal oscillator frequency is divided down using a programmable divider to provide a primary clock period, which can be selected in 10 nanosecond increments between 100 and 1250 nanoseconds. Further scaling of the dwell time is permissible and is described below in more detail in connection with FIG. 11.

The location of a pattern is determined by the pattern generator stage position and the 16-bit x,y major field data. A Major Field I/O card 128 receives fully corrected data from the system computer 64. The CPU 104 then sends the data to the major field DACs 76; differential line drivers on the Major Field I/O card 128 are used to transmit major field digital data over twisted pair lines to optocouplers/receivers in the octopole synthesis section. The 16-bit major field DACs 76 change the digital data to analog signals which are summed with the minor field analog signals. The Major Field I/O card 128 also includes stigmation I/O capability to convert digital data from the pattern generator into the analog voltages for beam stigmation control.

A video digitizer 130 digitizes the video information received from video processor 100 during a fiducial mark scan by the pattern generator. This digitized information is processed by CPU 104 to locate the center of the mark, which in turn is used in calculating coordinate transform parameters for scaling patterns and positioning the beam. The video digitizer is described in more detail below in connection with FIG. 14.

Figure 9:
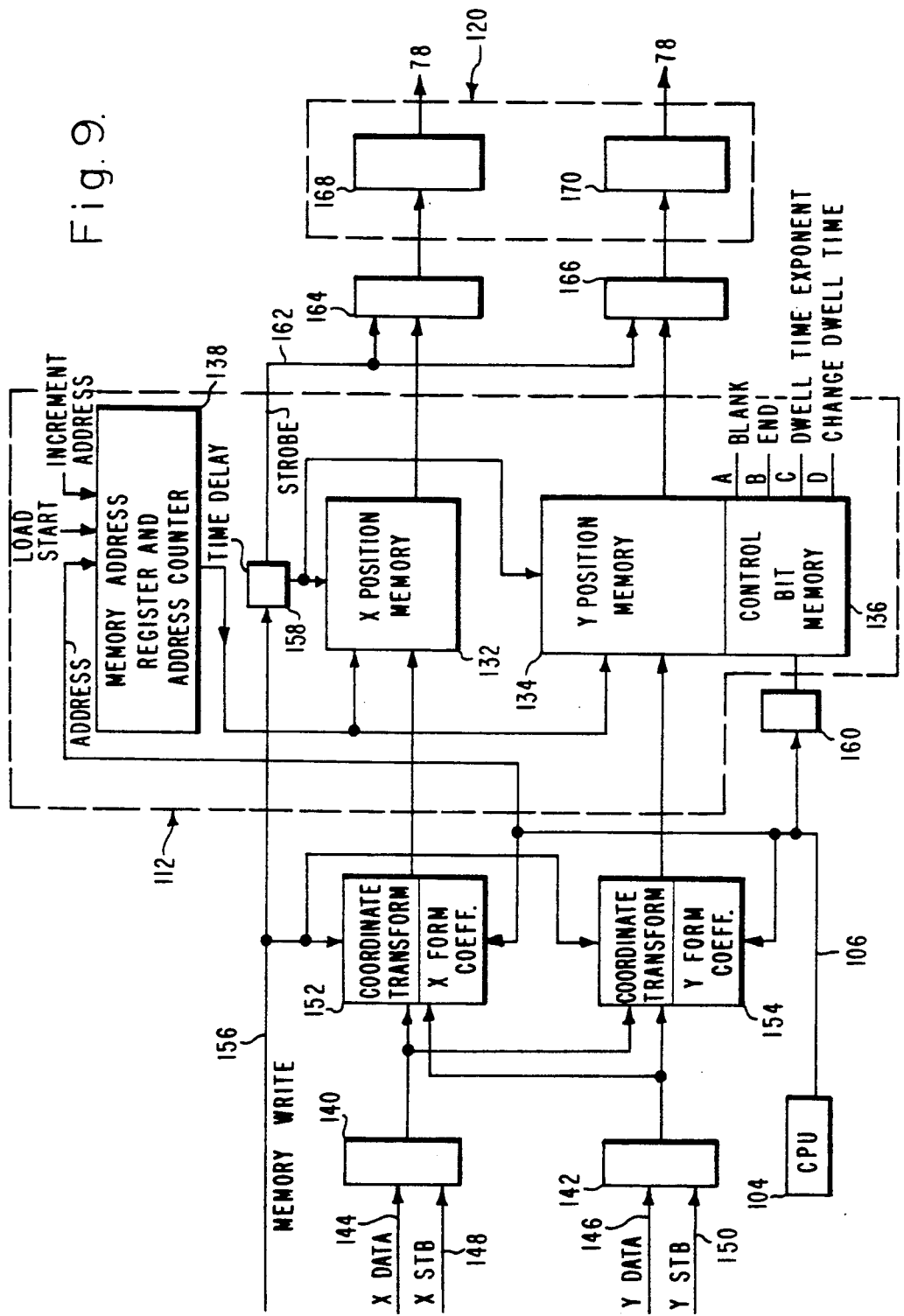
FIG. 9 is a schematic diagram of the pixelized pattern figure stores and associated input and output circuits.

FIG. 9 is a schematic diagram of the figure stores used to hold the pixelized FIB pattern information, and the circuitry used to load data into and read data out of the figures stores. A single figure store 112 is enclosed within a dashed line. It includes memories 132, 134 which are used to hold the x and y minor field pixel position information; the memories are preferably 64K×12 bit devices. Associated with the y-position memory 134 is an additional 64K×4 bit memory 136 which contains control bits related to beam blanking, pattern begin and end, and the beam dwell time for successive pixel locations. A counter 138 on the figure store card is incremented to generate the sequential pixel addresses during pattern writing. The figure store memory is part of the CPU 104 memory space and can be written to by the CPU like any other memory; the CPU views the figure store memory 132, 134 as a single 128K memory. The x and y data for a given pixel occupy adjacent memory locations.

Pixel position information can be provided either directly from the CPU to the figure store, or from the CPU through the coordinate transform system to the figure store as shown in FIG. 9. X and y pixel position data is supplied from the CPU to x and y pixel position registers 140 and 142, respectively, along respective x and y data lines 144 and 146. X and y strobe signals are applied to the respective pixel position registers on lines 148 and 150, respectively. The pixel position registers 140, 142 accumulate the pixel position data and transmit them to x and y coordinate transform circuits 152 and 154, respectively. These circuits perform the requisite coordinate system reconciliation and reformatting of the pixel position data under the control of CPU 104, and supply the re-formatted x and y pixel position data to the x and y position memories 132 and 134. A memory write signal is applied along line 156 to shift the pixel position information from the coordinate transform circuitry into the figure store memories; a time delay circuit 158 provides sufficient time for the position data to propagate through the coordinate transform system before it is clocked into the figure store memories. The memory address register and address counter 138 controls the beginning of an information load into the figure store memories, and increments the memory address positions.

The pixel position inputs to the coordinate transform circuitry could be provided from separate hardware accelerator circuits used to relieve the CPU, rather than from the CPU itself. In this event the pixel position data could be supplied directly to the coordinate transform circuitry without the intermediate pixel position registers 140 and 142.

The CPU 104 also provides a set of control bits corresponding to each pixel position. The control bits are accumulated in a control register 160, and loaded into the control bit memory 136 associated with the y pixel position memory 134. In the illustration of FIG. 9, four control bits are associated with each pixel location. The first control bit A establishes whether the beam is blanked or unblanked for that particular pixel location; this bit controls the status of mass separator 28 in the FIB column. The second bit B is used to indicate the end of a sequence of pixels. The third and fourth bits are reserved for the beam dwell time for each pixel location. Bit C represents an exponential value for the beam dwell time, while bit D is used to activate a pre-set change in the beam dwell time from the previous pixel locations. Further details of this particular dwell time control scheme are provided in connection with FIG. 11. Numerous other dwell time controls could be used, such as simply assigning sufficient bits to form a binary number corresponding to the desired dwell time for each separate pixel. While the approach taken in FIG. 9 is not as flexible as a simple binary number control, it is much more efficient in the number of required bits and is adequate for most implantation purposes.

To relieve the CPU from generating separate control bits for each different pixel location, control register 160 could be replaced with a FIFO (first in—first out) memory having a repeatable pattern of dwell times, with a reset capability. For example, the successive dwell time for each successive pixel in the FIFO could be increased or reduced by a constant amount from the dwell time for the previous pixel location, thus producing an implantation gradient. If it is desired to write successive lines of pixels with the same doping gradient for each line, the FIFO memory would be used to produce the gradient for a given line, and then reset at the end of a line to start the gradient over for the next line.

Successive pixel location data is clocked out of the x and y position memories 132, 134 in synchronism with their corresponding dwell times by a strobe signal applied along line 162 to high speed x and y data registers 164 and 166, respectively. The information is transmitted from the registers to the DACs 120, consisting of individual x and y position DACs 168, 170. These DACs in turn provide the minor field x and y analog control signals to the octopole driver 78.

To create a FIB pattern, the x and y pixel positions and the control bits are first loaded into their respective registers 140, 142 and 160. A memory write signal is then provided by the pattern clock generator 126 to move the pixel position data through the coordinate transform system and into the position memories 132 and 134, and to move the control bits into the control bit memory 136. The memory write signal then increments the memory address counter 138 so that the next memory positions are available for the next pixel position data. This sequence is repeated as required for each subsequent pixel location until all of the data for a given pattern is written into the figure store memories.

To write a pattern from the figure store, the minor field start address is loaded from the CPU into the memory address register 138. The pattern clock generator 126 increments the memory addresses, strobes the pixel position data into the DACs 168, 170, and sets the dwell time for each pixel by adjusting the time increment between successive pixel locations in accordance with the dwell time control bits. The readout of data from the position memories 132, 134 continues until the stored pattern has been written, at which time the system can switch to another figure store and immediately begin writing another pattern while the first figure store is re-loaded.

Figure 10:
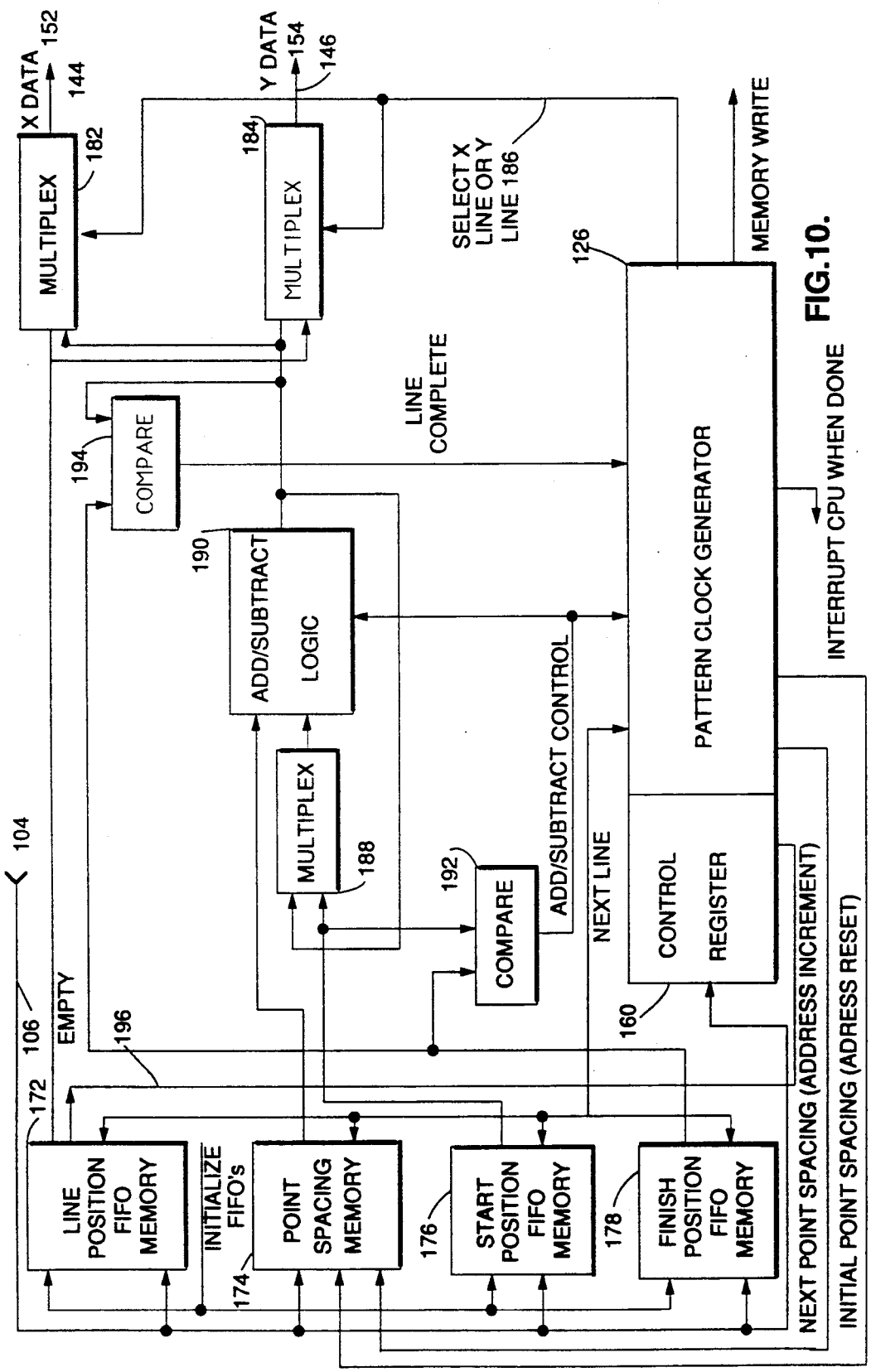
FIG. 10 is a schematic diagram of hardware that can be used to relieve the CPU in the generation of pixel (and dwell time) position controls.

As mentioned above, hardware circuitry can be provided to relieve the CPU in generating frequently used patterns. Such a hardware system, referred to as a "line-to-point accelerator", is shown in FIG. 10. The accelerator generates detailed position data for each individual pixel, so that the CPU only has to provide the beginning and ending pixel positions and spacing information between successive lines. A line position FIFO memory 172 stores the positions of successive lines in the direction orthogonal to the FIB writing direction. In other words, if the FIB is to write in the x direction, line position FIFO memory 172 will store the y positions of successive lines, and vice versa. A point spacing memory 174 stores the spacing between successive pixel locations in a line. If a spacing gradient is desired, the spacing between each successive pair of pixel locations can be incremented by a pre-set positive or negative amount with respect to the spacing between the previous pair. The start and finish positions for each line are stored in start position and finish position FIFO memories 176 and 178, respectively. Since FIFOs are used, the CPU can enter new line start/finish positions at the same time that lines already in the memories are run; this is quicker than loading all of the line start/finish positions into the memories at the beginning of a sequence.

At the beginning of a run, the pattern clock generator 126 causes the initial line position stored in memory 172 to be delivered to multiplexers 182 and 184, which respectively output the x and y position data over lines 144 and 146. Only one of the multiplexers 182, 184 will pass the line position signal, as determined by a selection control signal applied from the pattern clock generator 126 over line 186. The pattern clock generator also activates the delivery of the starting position on the line from memory 176, through a multiplexer 188, and into an add/subtract logic circuit 190. The add/subtract logic initially receives a "0" from point spacing memory 174, and accordingly passes the start position data to multiplexers 182 and 184. Under the control of the signal on select line 186, the start position is transmitted to the appropriate x or y output data line 144 or 146.

The period until the next command is produced by pattern clock generator 126 is governed by the pixel dwell time data stored in the control register 160. The CPU writes to controller register 160 to start a data generation pattern, and also to pattern store or direct write. The output of add/subtract logic 190 is fed back to its input through multiplexer 188. When the desired dwell time for the first pixel position has expired, the pattern clock generator enables the add/subtract logic to combine its previous position data with the increment provided from the point spacing memory 174. A comparison circuit 192 compares the desired finish position stored in memory 178 with the start position in memory 176 to determine whether the spacing between the first and second pixel locations should be added or subtracted from the first pixel location to arrive at the second location. The result is applied to the add/subtract logic 190, and sets the circuitry to either add or subtract the point spacing stored in memory 174 with respect to the current pixel position. The new pixel position is then transmitted from the logic circuit 190 to the multiplexers 182, 184, and from there to the appropriate output line 144 or 146.

Another comparison circuit 194 compares the position data at the output of add/subtract 190 with the line finish position stored in memory 178, and sends a signal to the pattern clock generator 126 when the line has been completed. The pattern clock generator then increments memories 172, 174, 176 and 178 to the data stored for the next line. The next line is written in a similar manner, as are all subsequent lines until the line position memory 172 is empty. At this time a signal is delivered from memory 172 over line 196 to the pattern clock generator, which produces a signal to interrupt the CPU.

Multiple accelerators such as that illustrated in FIG. 10 may be used to generate different patterns, with each accelerator repeating the same pattern at a position determined by the CPU. The CPU informs the pattern clock generator when all of the memories in a particular accelerator have received the required data from the CPU, at which time the timing and control unit executes the pattern generation run as fast as it can. A similar accelerator can be used to develop a desired dwell time pattern in hardware.

Figure 11:
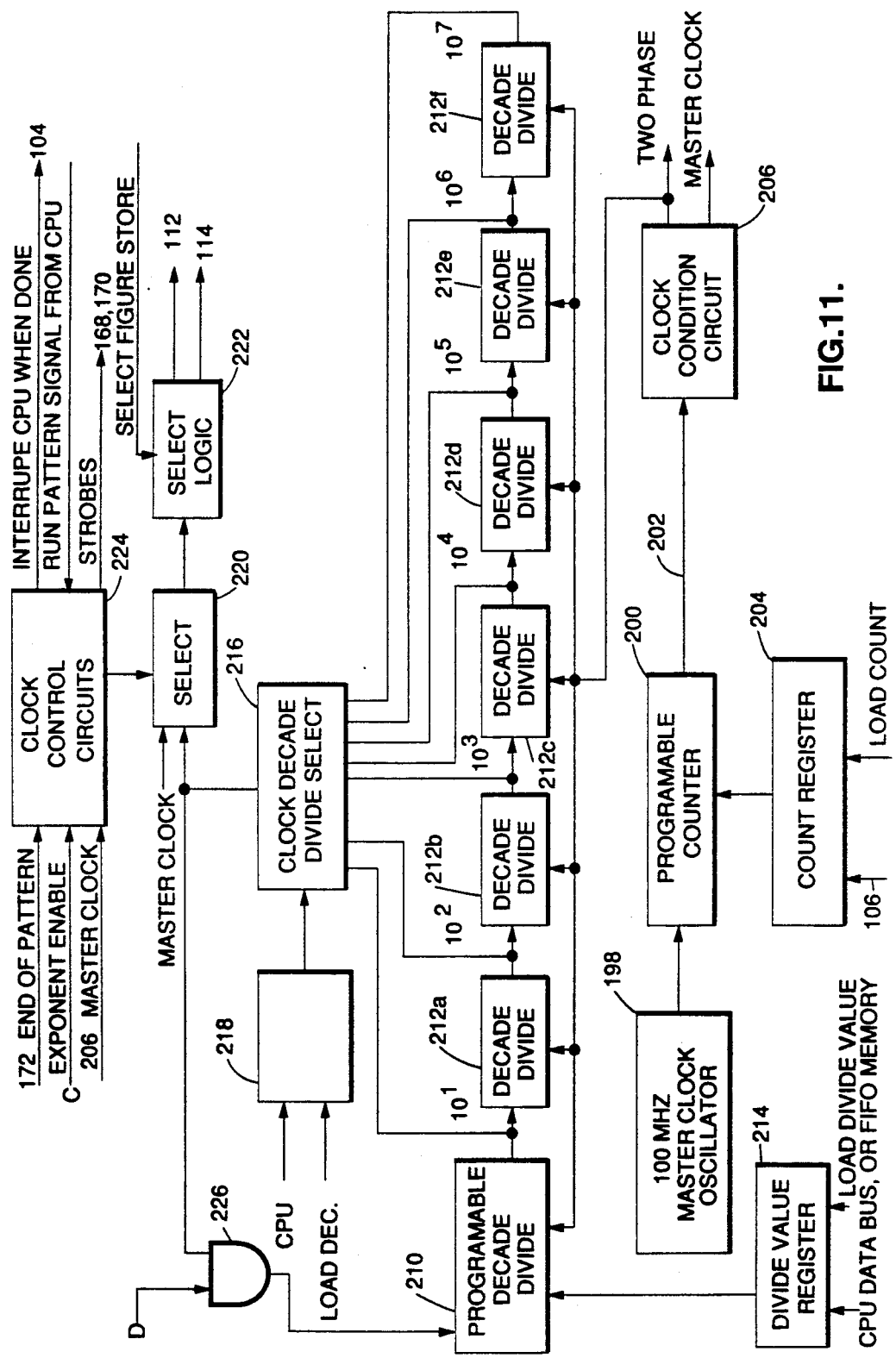
FIG. 11 is a schematic diagram of a clock circuit used to coordinate the system.

FIG. 11 is a schematic diagram of the pattern clock generator 126. It includes a 100 MHz master clock oscillator 198 which feeds a programmable counter 200. The counter 200 is set to produce a desired clock period over output line 202 from 100–1,250 nanoseconds, with a 10 nanosecond resolution. The clock period is set by a signal from the CPU over bus 106 into a count-register 204, which loads the desired count into programmable counter 200 under the influence of an applied load count signal. A clock condition circuit 206 performs a level translation to generate a two-phase master clock with asymmetrical clock pulses (the width of the clock pulses is significantly less than the interval between pulses).

The master clock signal on line 208 is applied to a programmable decade divide circuit 210, and as a synchronizing signal to series connected decade divide circuits 212a, 212b, 212c, 212d, 212e and 212f. Each decade divide circuit divides the output frequency of the prior decade divide by 10, or in other words they increase the clock period by a factor of ten. The relative clock periods at the outputs of each decade divide are indicated by the exponential values of 10 given in FIG. 11.

The programmable decade divide 210 permits the master clock period to be reduced from a nominal value of 10 to any desired integer value between 2 to 9. A desired subtraction factor is loaded from the CPU data bus, or an appropriate FIFO memory in an accelerator hardware circuit, into a divide value register 214, and then applied to the programmable decade divide 210 where it is subtracted from the master clock value.

The desired clock exponent is selected from the various decade divide circuits by a clock decade divide select circuit 216, which operates under the control of a decade select register 218 that has been loaded from the CPU. The output of select circuit 216 is provided to another select circuit 220, which selects between the divided clock output from circuit 216 or the master clock. The result is applied to figure store select logic 222, which selects the appropriate figure store 112 or 114 (assuming only two figure stores ar used) for delivery of the clock signals. There they are used to clock out the pixel location commands, as described above.

Clock control circuitry 224 is provided to control the transmission of clock signals to the figure stores, and also to provide synchronized strobe signals for the minor field DACs 168 and 170. The clock control circuitry receives inputs indicating a run pattern signal from the CPU, an end of pattern signal or end bit from a figure store control bit memory, a master clock signal, and the dwell time exponent control bit C from the control bit memory 136. The pattern clock generator begins to run and produce output clock signals upon receiving a "run pattern signal" from the CPU, and continues to run until an "end of pattern" bit is encountered. The exponent ENABLE signal C is used to change the exponent of the output clock signal by either increasing or reducing the clock signal by factors of 10, depending upon the selected clock divide. When no exponent ENABLE signal C is present, the output clock signal continues to run with the same exponent.

The output from the clock decade divide select circuit 216 is also applied to an AND gate 226, from which its passage to the programmable decade divide circuit 210 is controlled by the status of the "change dwell time" signal D in the control bit memory 136. If a shortened dwell time is desired, signal D is high, allowing gate 226 to pass the clock gate output to activate the programmable decade divide function 210. The dwell time is then reduced in accordance with the setting of divide value register 214. If no reduction in dwell time is desired, signal D is low to inhibit the loading of a divide value from programmable decade divide 210.

The circuit of FIG. 11 is designed for a dwell time control which occupies only two bits. If it is permissible to use considerably more bits for this function so that the dwell times can be represented directly by binary numbers, the FIG. 11 circuit could be redesigned so that the dwell time command could be applied directly to the clock decade divide select circuit 216 and programmable decade divide 210, or programmable counter 200.

Figure 12:
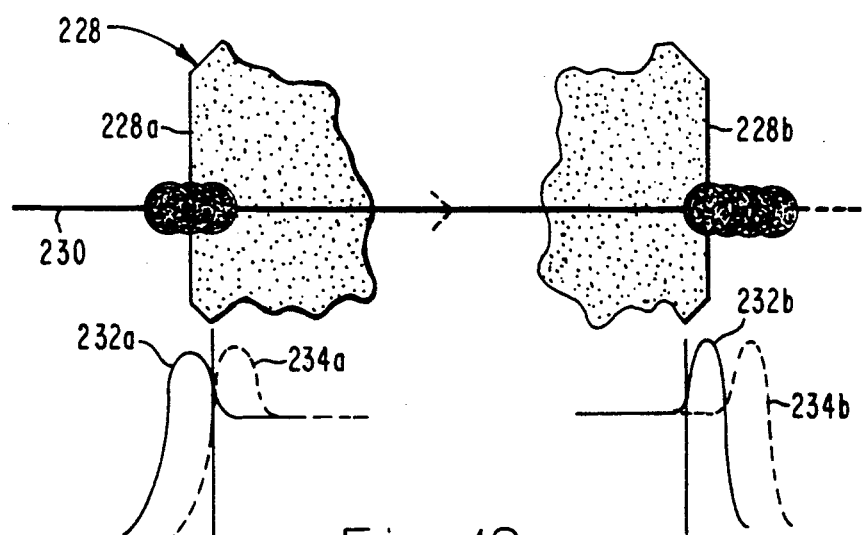
FIG. 12 is a diagram illustrating a delay problem in reading a fiducial mark.

The new FIB control system can be used to locate fiducial marks on the target substrate with greater precision than has previously been achieved. A problem in fiducial mark location encountered in the past is illustrated in FIG. 12. Typically, a FIB has been scanned across an arm 228 of a raised fiducial mark on the substrate surface, along a unidirectional scan line 230. The impact of the beam on the surface produces an emission that can be converted to a video signal. A discontinuity in the video signal occurs when the beam crosses the opposed edges 228a, 228b of the mark. The actual emission pattern produced is indicated by the solid curves 232a, 232b. The center of the mark can then be calculated by simply averaging these two positions. However, because of finite time delays in the beam transit time to the substrate and in the subsequent signal processing, the perceived video signal may be delayed, as indicated by dashed curves 234a, 234b. This leads to an inaccuracy in the calculation of the mark's position.

Figure 13:
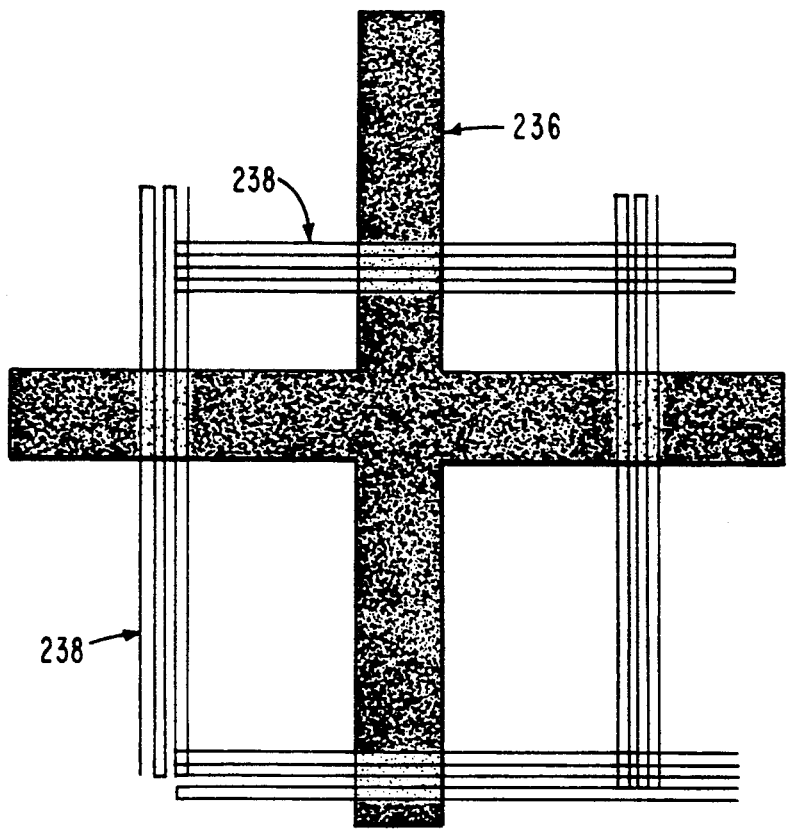
FIG. 13 is a diagram illustrating the scanning of a fiducial mark in accordance with the invention to cancel the delay problem.

A solution to this problem that can be implemented with the present FIB control system is illustrated in FIG. 13. Rather than simply scanning across the mark in one direction, the arms of a fiducial mark 236 are scanned in pixelized, generally serpentine patterns 238, with the beam traversing back and forth across the mark and reversing direction for each successive scan. Thus, if beam transit and processing delays make the mark appear to be shifted to the right of its actual position for a scan from left to right, the mark will appear to be shifted by an equal amount to the left of its actual position for a scan from right to left. The actual position of the mark is then determined by averaging the detected edge crossing positions for the opposite-directed scans, so that the error from scanning in one direction is canceled by an equal and opposite error in scanning in the opposite direction.

Figure 14:
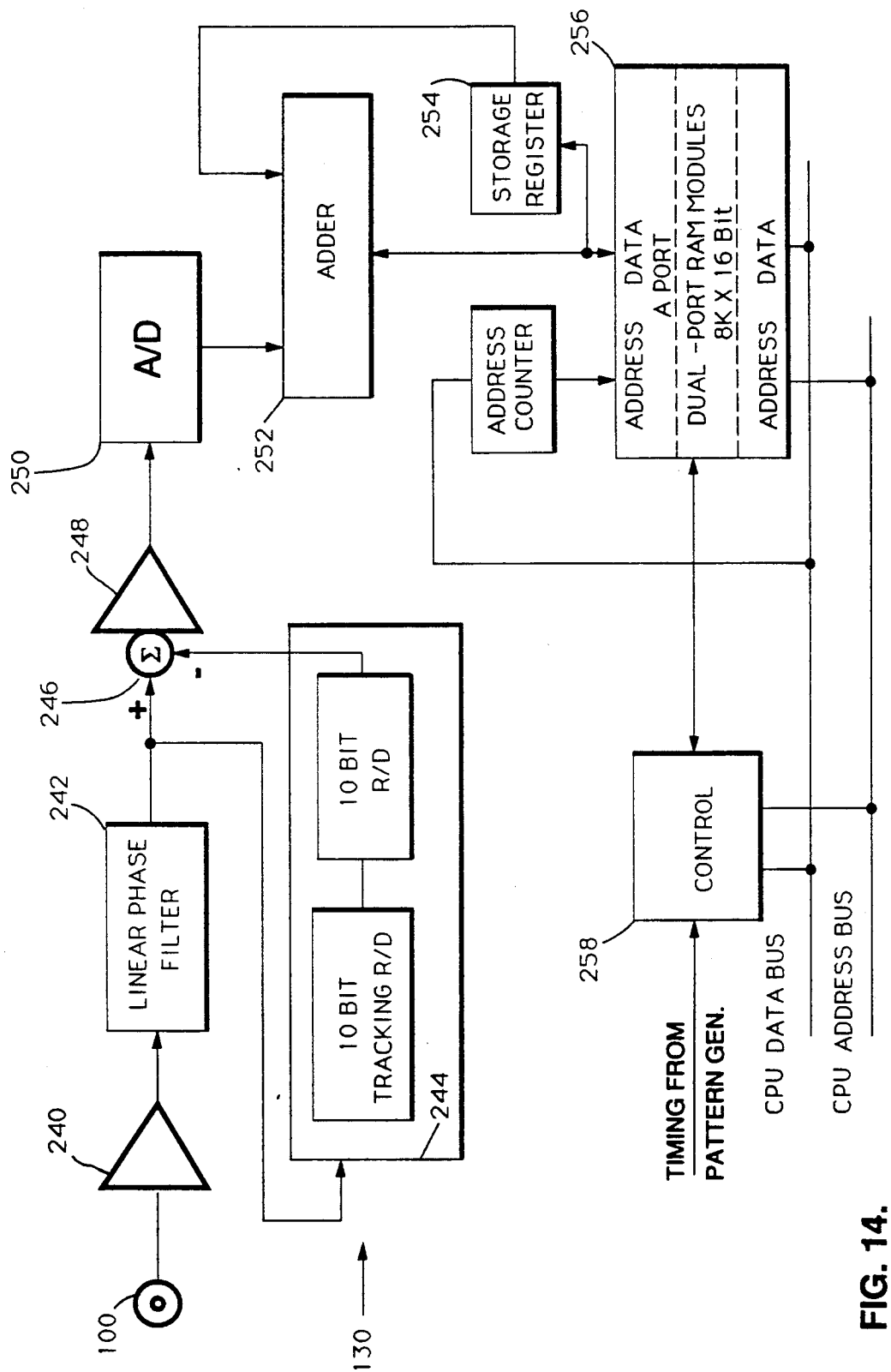
FIG. 14 is a schematic diagram of a video digitizer circuit used in connection with the fiducial mark readout.

A video digitizer 130 that is suitable for this purpose is shown in FIG. 14. It digitizes the video information received from the video processor 100 (FIG. 7) during a fiducial mark scan generated by the pattern generator. This digitized information is processed by the CPU 104 to locate the center of the mark. The mark location information in turn is used in calculated coordinate transform parameters for scaling patterns and positioning the beam.

Video signals from the video processor 100 are transmitted through a buffer amplifier 240 to a linear phase filter 242, which is a low pass filter used to optimize the signal-to-noise ratio. Before fiducial mark registration or as needed, the FIB is blanked and the DC level of the video signal is captured by a video black level restoration circuit 244. This level is subtracted from the incoming video signal at a summing injunction 246 to produce a zero volt black level. The video signal then passes through a programmable gain amplifier 248 whose gain/attenuation is under software control.

After amplification, the video signal is digitized by an analog-to-digital converter 250. Averaging of successive video signals either without storage, or averaging the present signal with a stored value (for example, line averaging) can be implemented. A digitized video sample is added to previous samples in an adder 252-storage register 254 loop and/or stored in a dual port random access memory (RAM) 256. Using a dual port RAM for storage of the averaged video data allows the central computer to begin using the data as soon as local averaging is complete. A control 258 slaves the memory operation to the pattern generator.

Figure 15:
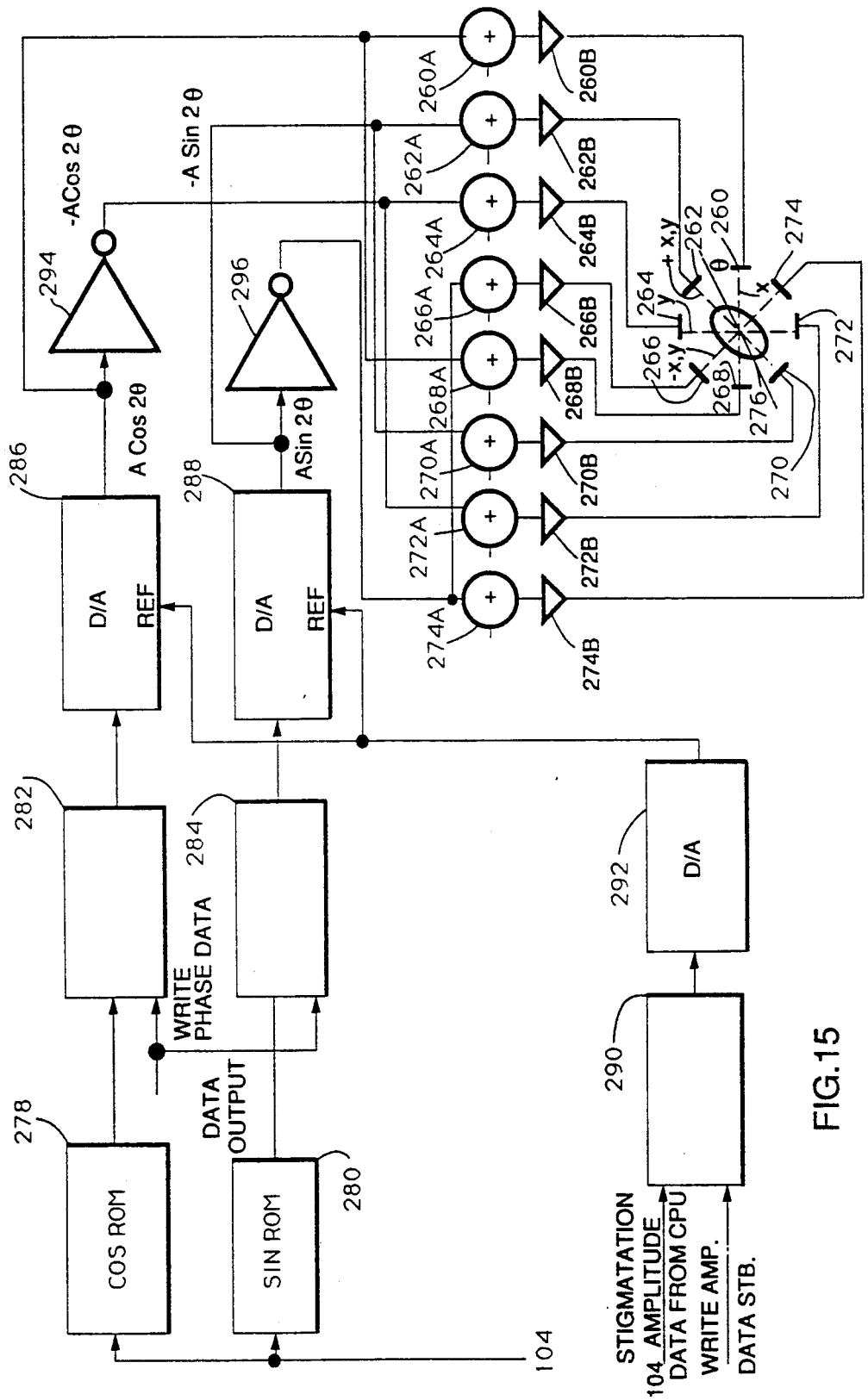
FIG. 15 is a schematic diagram of the stigmation control portion of the invention.

A new stigmation control system used in connection with the present FIB controller is shown in FIG. 15. The FIB ideally has a circular cross-section, but in practice generally has a somewhat elliptical distortion. Past FIB systems have attempted to mitigate this distortion by adjusting the voltages of the octopole plates. However, reasonably accurate adjustments could be achieved only for one or two angles of the beam spot's major elliptical axis with respect to the octopole plates. The present invention greatly expands this capability, and provides stigmation control for any arbitrary angle of the major elliptical axis.

This significant improvement is related to a recognition of a trigonometric relationship between the beam's major elliptical axis and the voltage adjustments that should be made to the octopole plates to reduce or eliminate the ellipticity. In FIG. 15 the eight octopole plates are indicated, in counterclockwise order, by reference numerals 260, 262, 264, 266, 268, 270, 272 and 274. The axis between the opposed plates 260 and 268 is arbitrarily designated as the X axis, the perpendicular axis between plates 264 and 272 as the Y axis, the axis between plates 262 and 270 as the +X,Y axis, and the axis between plates 266 and 274 as the −X,Y axis. Taking $\theta$ as the angle between the beam spot's major elliptical axis and the X axis, stigmation control for any arbitrary angle $\theta$ can be achieved by applying voltage signals in the form of $A\cos 2\theta$, $-A\cos 2\theta$, $A\sin 2\theta$ and $-A\sin 2\theta$ to the X, the Y, the +X,Y and the −X,Y axis plates, respectively, where A is a constant representing the degree of beam ellipticity. For example, in FIG. 15 a beam spot 276 is shown with a major elliptical axis at an angle of 30° to the X axis. Adjustment voltages proportional to cos 60° would be applied to plates 260 and 268, −cos 60° to plates 264 and 272, sin 60° to plates and 270, and −sin 60° to plates 266 and 274.

Circuitry for implementing this stigmation compensation includes a cosine function ROM 278 and a sine function ROM 280, which are supplied with the angle of the beam's major elliptical axis from the CPU 104. $\cos 2\theta$ and $\sin 2\theta$ values are supplied from the ROMs to data latches 282 and 284, respectively, and from there to two-quadrant multiplying digital-to-analog converters 286 and 288, where they are converted to analog values. The stigmation amplitude, as opposed to its angle, is written into a data latch 290 from the CPU 104, and supplied therefrom to a digital-to-analog converter 292. The output of converter 292 is used as a reference for converters 286 and 288 to scale the magnitude of their signals.

The $A\cos 2\theta$ signal from DAC 286 is transmitted through a pair of summing junctions 260A and 268A and amplifiers 260B and 268B to octopole plates 260 and 268, respectively. The $A\cos 2\theta$ signal is also inverted and buffered by an operational amplifier 294, the output of which is a $-A\cos 2\theta$ signal that is transmitted through summing junctions 264A and 272A, and amplifiers 264B and 272B, to octopole plates 264 and 272.

In a similar manner the $A\sin 2\theta$ signal at the output of DAC 288 is amplified through corresponding summing junctions and amplifiers to octopole plates 262 and 270, while the $A\sin 2\theta$ signal is inverted and buffered by op amp 296 for application through corresponding summing junctions and amplifiers to plates 266 and 274. In this manner the appropriate stigmation compensation signals are applied to the various octopole plates. A change in the angle of the beam spot's major elliptical axis or its degree of ellipticity can be accommodated by a simple adjustment of the angle and amplitude values input into the stigmation control circuitry.

It should be noted that the stigmation control voltages merely modify the basic beam deflection voltages applied to the octopole plates, and do not supplant them. Accordingly, the summing junctions associated with each of the plates in FIG. 15 have lead lines to receive the basic beam deflection signals for summing with the stigmation control signals.

Figure 16:
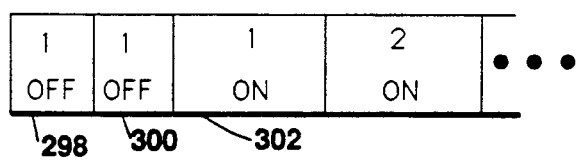
FIG. 16 is an illustration of an initializing sequence which compensates for a delay required to move the FIB to an initial location.

At the beginning of a write pattern, it may be desirable to allow a little extra time for the beam to settle at the initial start position. For this purpose one or more extra short periods may be added to the dwell time for the initial pixel location, with the beam blanked during the initial extra periods. This scheme is illustrated in FIG. 16, in which three pixel commands 298, 300 and 302 are given for the first pixel location, followed by the successive pixel commands in the normal sequence. Commands 298 and 300 are short initializing commands for the first pixel location, in which the beam is commanded to be blanked, or "OFF". The short time duration for these commands can be effected by having select switch 220 in the clock generator (FIG. 11) select a few master clock counts for pixel commands 298 and 300, rather than the longer dwell time from the decade divide circuit.

Figure 17:
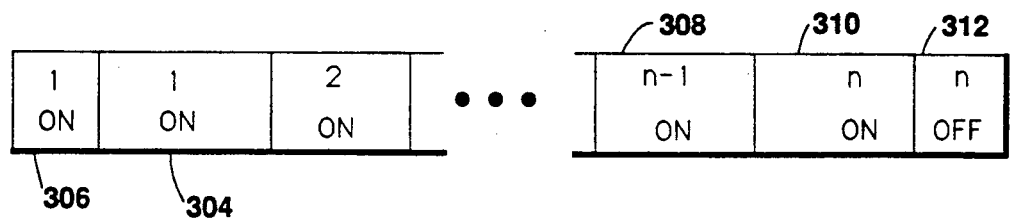
FIG. 17 is an illustration of an initializing and termination control pattern used to compensate for delays resulting from the FIB transit time.

Another inaccuracy can result from the finite time required for the beam to travel between the mass separator 28 and the octopole deflector 52 in the FIB column. At the instant of execution, the beam blanking commands will operate on a different portion of the beam than the beam deflection commands; in effect the beam deflection will anticipate the beam blanking. This problem can generally be resolved by extending the beam dwell time for the initial pixel location in a pattern by a short period of time that is sufficient to compensate for the beam transit time, and then blanking the beam at the end or to the end of its normal dwell time at the last pixel location. This approach is illustrated in FIG. 17. The desired dwell time for the first pixel location is represented by command 304. This command is preceded by a short command 306 for the same initial pixel location. Command 306 is for a duration equal to the beam transit time, and may be established by a few master clock counts. The beam is unblanked, or "ON", for both commands 304 and 306. Writing will not commence until the beginning of command 304, since the beam will not have reached the octopole deflector until the end of command 306.

Writing of the pattern continues in the normal fashion after the first pixel, through the next to last (n−1) pixel 308. The final (n) pixel in the pattern is divided into two parts: a first command 310 with the beam at the n position and unblanked ("ON"), followed by a shorter command 312 at the same n pixel location but with the beam blanked ("OFF"). The dwell time for command 312 is the same as for command 306, and equals the beam transit time. During command 312 the beam that passed the mass separator 28 prior to execution of the blanking command will continue to write at the n pixel location, thus yielding a total dwell time equal to the sum of the individual dwell times for commands 310 and 312.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A charged particle beam system comprising:
means for generating a charged particle beam;
beam deflecting means for deflecting the beam across a target;
a control system for the beam which includes means for controlling the beam deflecting means to deflect the beam through a sequence of successive pixel locations, and to dwell at each of said pixel locations for controlled dwell times, and
means for adjusting the beam dwell time for different pixel locations,
wherein said means for controlling the beam dwell time includes means for establishing an initial dwell time for the first pixel in a sequence of pixels, and for adjusting the beam dwell time by a set of predetermined increments for successive pixels in said sequence to establish a predetermined dwell time gradient over said sequence.

2. The charged particle beam system of claim 1, including a memory means for storing a predetermined set of dwell times which incorporate said set of predetermined dwell time increments, and means for supplying said predetermined pixel dwell times from said memory means to said beam deflecting means in coordination with the deflection of the beam through said sequence of successive pixel locations.

3. The charged particle beam system of claim 2, said memory means including means for storing a plurality of different sets of dwell times incorporating different sets of dwell time increments, and further comprising means for selecting among said sets of dwell times to supply to said beam deflecting means.

4. The charged particle beam system of claim 1, including a figure store for accumulating and providing control signals to said means for controlling the beam deflecting means, and a clock for clocking data out of the figure store, said clock being programmable to coordinate the clocking of data out of the figure store with the desired beam dwell times.

5. The charged particle beam system of claim 1, further comprising means for controlling the blanking state of the beam at each of said pixel locations.

6. The charged particle beam system of claim 5, said means for controlling the beam deflecting means comprising memory means for storing a sequence of pixel location and corresponding blanking state information, means for feeding a sequence of pixel location and corresponding blanking state information into said memory means, means for establishing a sequence of pixel dwell times corresponding to said sequence of pixel location information, and means for applying the information from said memory means to said beam deflection control means and said beam blanking state control means in coordination with said sequence of pixel dwell times.

7. The charged particle beam system of claim 6, further comprising means for adjusting said sequence of pixel location information prior to its being fed into said memory means to reconcile the target coordinate system with the beam deflecting means coordinate system.

8. The charged particle beam system of claim 1, said means for deflecting the beam across a target comprising means for holding the target stationary and for moving the beam with respect thereto.

9. The charged particle beam system of claim 1, said charged particle beam comprising a focused ion beam.

10. A charged particle beam system comprising:
means for generating a charged particle beam;
beam deflecting means for deflecting the beam across a target;
a control system for the beam which includes means for controlling the beam deflecting means to deflect the beam through a sequence of successive pixel locations, and to dwell at each of said pixel locations for controlled dwell times, said means for controlling the beam deflecting means including means for adjusting the amount of beam deflection between successive pixel locations in a sequence of pixels and means for establishing an initial beam deflection between initial pixels in a sequence of pixels, and for adjusting the beam deflection by a set of predetermined increments for successive pixels in said sequence to establish a predetermined beam deflection gradient over said sequence.

11. The charged particle beam system of claim 10, including a central processing unit for establishing said initial beam deflection, hardware means for generating said deflection increments, and means for supplying said predetermined defection increments from said hardware means to said beam deflecting means after the beam has been deflected through said initial deflection.

12. A charged particle beam system comprising:
means for generating a charged particle beam;
beam deflecting means for deflecting the beam across a target;
a control system for the beam which includes means for controlling the beam deflecting means to deflect the beam through a sequence of successive pixel locations, and to dwell at each of said pixel locations for controlled dwell times,
said beam deflecting means comprising an octopole deflector having eight deflection plates distributed generally symmetrically around the beam, with two opposed plates on an x-axis, two opposed plates on a y-axis perpendicular to the x-axis, two opposed plates on a +x,y-axis approximately 45° to one side of the x-axis, and two opposed plates on a −x,y-axis approximately 45° to the other side of the x-axis, further comprising stigmation control means for rounding elliptically shaped beams, said stigmation control means comprising means for applying voltage signals in the form of $A\cos2\theta$, $-A\cos2\theta$, $A\sin2\theta$ and $-A\sin2\theta$ to the x-axis, y-axis, +x,y-axis and −x,y-axis plates, respectively, where A is a constant representing the degree of beam ellipticity, and $\theta$ is the angle of the beam's major elliptical axis with respect to the x-axis.

13. A charged particle beam system comprising:
means for generating a charged particle beam;
means for deflecting the beam across a target, and
a control system for the beam which includes:
means for controlling the beam deflecting means to perform pattern scanning through an arbitrary sequence of pixel locations, and to dwell at each of said pixel locations for controlled dwell times,
fiducial mark recognition means for controlling said beam deflection means to execute multiple scans in pixelized patterns across a fiducial mark having opposed edges on a target in opposed directions,
means for monitoring emissions from the target to detect the crossing of the fiducial mark edges during each scan and to generate signals in response thereto,
means for compiling the locations of the detected crossings for opposed scans to derive a fiducial mark location which is generally independent of detection delays associated with scanning the fiducial mark in a single direction, and
processing means for averaging said signals.

14. The charged particle beam system of claim 13, said fiducial mark recognition means controlling the beam deflection means to scan the beam across a fiducial mark an equal number of times in each direction, and said means for compiling the locations of the detected crossings comprising means for averaging the locations of corresponding crossings for said scans.

15. A method of exposing a surface to a charged particle beam comprising:
generating a charged particle beam;
generating a pattern of sequential pixel locations along the surface;
directing the beam along the surface in accordance with said pattern of sequential pixel locations, and
causing the beam to dwell at each of said pixel locations for controlled dwell times, wherein said beam dwell times are controlled by generating a pattern of beam dwell times corresponding to said pixel locations, and applying a dwell time to the beam at each pixel location in accordance with said pattern of beam dwell times, and wherein the beam dwell time is adjusted by a set of predetermined increments for successive pixels in a sequence of pixels to establish a predetermined dwell time gradient over said sequence.

16. The method of claim 15, wherein said beam dwell times are applied to the beam by storing said pattern of beam dwell times in a memory and calling up the pattern from said memory to apply it to the beam.

17. The method of claim 16, wherein plurality of different beam dwell time patterns are stored in said memory, and said dwell time gradient is selected by selecting among said beam dwell time patterns to call up and apply to the beam.

18. The method of claim 15, wherein said pattern of sequential pixel locations is generated by non-uniform spacings between a set of sequential locations in said pattern.

19. The method of claim 18, wherein said pattern of sequential pixel locations is generated with spacings between said set of sequential locations which differ from pixel location to pixel location within said set by predetermined increments to establish a predetermined spacing gradient between successive pixel locations in said set.

20. The method of claim 19, wherein the initial pixel location in said sequence is established by a central processing unit (CPU) and the subsequent pixel locations in the sequence are established by a hardware location generating algorithm which is responsive to said CPU.

21. A method of exposing a surface to a charged particle beam, comprising:
generating a charged particle beam;
generating a pattern of sequential pixel locations along the surface;
directing the beam along the surface in accordance with said pattern of sequential pixel locations, and
causing the beam to dwell at each of said pixel locations for controlled dwell times,
wherein an octopole deflector is used to direct the beam across the surface, the octopole deflector having eight deflection plates distributed generally symmetrically around the beam, with two opposed plates on an x-axis, two opposed plates on a y-axis perpendicular to the x-axis, two opposed plates on a +x,y-axis approximately 45° to one side of the x-axis, and two opposed plates on a −x,y-axis approximately 45° to the other side of the x-axis, further comprising the step of reducing the beam stigmation for elliptical beams by applying voltage signals in the form of $A\cos2\theta$, $-A\cos2\theta$, $A\sin2\theta$ and $-A\sin2\theta$ to the x-axis, y-axis, +x,y-axis and −x,y-axis plates, respectively, where A is a constant representing the degree of beam ellipticity, and $\theta$ is the angle of the beam's major elliptical axis with respect to the x-axis.

22. A method of exposing a surface to a charged particle beam, comprising
generating a charged particle beam;
generating a pattern of sequential pixel locations along the surface;
pattern scanning with the beam along the surface in accordance with said pattern of pixel locations in arbitrary sequence, and
causing the beam to dwell at each of said pixel locations for controlled dwell times, wherein said pattern of pixel locations is generated to direct the beam in multiple scans in pixelized patterns across a fiducial mark having opposed edges on the surface in opposed directions, further comprising the steps of monitoring emissions from the surface to detect the crossing the fiducial mark edges during each scan and generating signals in response thereto, and deriving the fiducial mark location from said opposed scans so that it is generally independent of detection delays associated with scanning the fiducial mark in a single direction, said step of deriving including averaging said signals.

23. The method of claim 22, wherein said pattern of pixel locations is generated to direct the beam in an equal number of scans across the fiducial mark in each direction, and the fiducial mark location is derived by averaging the locations of corresponding crossings for said scans.

24. A method of exposing a surface to a charged particle beam, comprising:
generating a charged particle beam;

generating a pattern of sequential pixel locations along the surface;

directing the beam along the surface in accordance with said pattern of sequential pixel locations, and causing the beam to dwell at each of said pixel locations for controlled dwell times, and further comprising the step of controlling the beam blanking state at each of said pixel locations, wherein the initial pixel location in said pattern is repeated at least once to provide sufficient time for the beam to move to said initial location, and the beam is blanked for all but the final repetition of said initial pixel location.

25. A method of exposing a surface to a charged particle beam, comprising:

generating a charged particle beam;

generating a pattern of sequential pixel locations along the surface;

directing the beam along the surface in accordance with said pattern of sequential pixel locations, and causing the beam to dwell at each of said pixel locations for controlled dwell times, and further comprising the step of controlling the beam blanking state at each of said pixel locations, wherein the beam dwell time at the initial pixel location in said pattern is extended by a time sufficient to compensate for the beam transit time, and the beam is blanked a corresponding time prior to the end of its dwell time at the last pixel location in said pattern.

26. An ion implantation method comprising:

moving a focused ion beam (FIB) between successive pixel locations on a substrate into which implantation is desired, allowing the FIB to dwell at said pixel locations for predetermined dwell times, and varying the spacing on the substrate between at least some of said successive pixel locations, wherein the spacing between successive pixel locations is progressively incremented to develop an implantation gradient along said locations.

27. The method of claim 26, wherein said pixel locations are progressively overlapped towards the higher implantation end of said gradient.

28. An ion implantation method, comprising:

moving a focused ion beam (FIB) between successive pixel locations on a substrate into which implantation is desired, controlling the FIB dwell time at each of said pixel locations, and varying the FIB dwell time among at least some of said pixel locations.

29. The method of claim 28, wherein the FIB dwell time for successive pixel locations is progressively incremented to develop an implantation gradient along said locations.

30. A method of reducing elliptical distortion of a charged particle beam traversing an octopole deflector having eight deflection plates distributed generally symmetrically around the beam with two opposed plates on an x-axis, two opposed plates on a y-axis perpendicular to the x-axis, two opposed plates on a +x,y-axis approximately 45° to one side of the x-axis, and two opposed plates on a −x,y-axis approximately 45° to the other side of the x-axis, comprising applying voltage signals in the form of $A\cos2\theta$, $-A\cos2\theta$, $A\sin2\theta$ and $-A\sin2\theta$ to the x-axis, the y-axis, the +x,y-axis and the −x,y-axis plates, respectively, where A is a constant representing the degree of beam ellipticity, and $\theta$ is the angle of the beam's major elliptical axis with respect to the x-axis.

31. A method of detecting the position of a fiducial mark having opposed edges on the surface of a substrate, comprising:

directing a beam in multiple scans in pixelized patterns across the fiducial mark in opposed directions, monitoring emissions from the surface to detect the crossing of the fiducial mark edges during each scan and to generate signals in response thereto, and deriving the fiducial mark location from said opposed scans so that the location is generally independent of detection delays associated with scanning the fiducial mark in a single direction, said step of deriving including:

averaging said signals using processing means to locate the center of the mark.

32. The method of claim 31, wherein the beam is directed in an equal number of scans across the fiducial mark in each direction, and the fiducial mark location is derived by averaging the locations of corresponding crossings for said scans.

* * * * *